United States Patent
Kim et al.

(10) Patent No.: US 7,948,024 B2
(45) Date of Patent: May 24, 2011

(54) MULTI-LAYERED, VERTICALLY STACKED NON-VOLATILE MEMORY DEVICE AND METHOD OF FABRICATION

(75) Inventors: Suk-pil Kim, Yongin-si (KR); Yoon-dong Park, Yongin-si (KR); June-mo Koo, Seoul (KR); Tae-eung Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 151 days.

(21) Appl. No.: 12/484,339

(22) Filed: Jun. 15, 2009

(65) Prior Publication Data
US 2010/0006919 A1    Jan. 14, 2010

(30) Foreign Application Priority Data
Jul. 11, 2008    (KR) .................... 10-2008-0067766

(51) Int. Cl.
*H01L 21/336* (2006.01)
(52) U.S. Cl. ................. 257/318; 257/E21.652; 438/259
(58) Field of Classification Search .......... 257/315, 257/318, E21.652, E21.693, E27.096, E27.107, 257/E29.304; 438/257, 259
See application file for complete search history.

(56) References Cited

U.S. PATENT DOCUMENTS
| 6,486,027 B1 * | 11/2002 | Noble et al. ................. 438/259 |
| 6,677,204 B2 | 1/2004 | Cleeves et al. |
| 2008/0242034 A1 * | 10/2008 | Mokhlesi et al. ............. 438/287 |

FOREIGN PATENT DOCUMENTS
JP    2008172164 A    7/2008
KR    1020060089547 A    8/2006
* cited by examiner

*Primary Examiner* — Thomas L Dickey
(74) *Attorney, Agent, or Firm* — Volentine & Whitt, PLLC

(57) ABSTRACT

A nonvolatile memory device is provided that includes; a first semiconductor layer extending in a first direction, a second semiconductor layer extending in parallel with and separated from the first semiconductor layer, an isolation layer between the first semiconductor layer and second semiconductor layer, a first control gate electrode between the first semiconductor layer and the isolation layer, a second control gate electrode between the second semiconductor layer and the isolation layer, wherein the second control gate electrode and first control gate electrode are respectively disposed at opposite sides of the isolation layer, a first charge storing layer between the first control gate electrode and the first semiconductor layer, and a second charge storing layer between the second control gate electrode and the second semiconductor layer.

7 Claims, 10 Drawing Sheets

MULTI-LAYERED, VERTICALLY STACKED NON-VOLATILE MEMORY DEVICE AND METHOD OF FABRICATION

CROSS-REFERENCE TO RELATED APPLICATION

This application claims the benefit of Korean Patent Application No. 10-2008-0067766 filed on Jul. 11, 2008, the subject matter of which is hereby incorporated by reference.

BACKGROUND

The inventive concept relates generally to semiconductor devices, and more particularly, to nonvolatile memory devices capable of recording or erasing data using a charge storing layer. The inventive concept also relates to methods of fabricating this type of nonvolatile memory device.

Host electronic systems incorporating semiconductor devices have become increasingly small in size, but are nonetheless required to process (i.e., store, manipulate, retrieve and erase) large amounts of data. Thus, there is a constant demand for increased operating speed, functional flexibility, and greater integration density in contemporary electronic systems that incorporate nonvolatile memory devices. The resulting scarcity of physical space within electronic systems has motivated designers to implement multi-level nonvolatile memory devices as replacements for conventional single-level devices.

Multi-level nonvolatile memory devices are characterized by a plurality of vertically (i.e., a Z-direction oriented) stacked constituent layers. Each individual layer typically comprises a memory cell array and tends to occupy a lateral footprint (i.e., an X/Y cross-section) about the same size as many conventional single-level, nonvolatile memory devices. The arrangement of components within the multi-level nonvolatile memory devices will vary with design and the fabrication techniques used to mechanically stack and electrically connect the components. Unfortunately, as the number of stacked layers in a multi-level nonvolatile memory device increases, the difficulties associated with fabrication and testing also increase and such difficulties drive up overall manufacturing costs.

SUMMARY

According to an aspect of the inventive concept, there is provided a nonvolatile memory device comprising; a first semiconductor layer extending in a first direction, a second semiconductor layer extending in parallel with and separated from the first semiconductor layer, an isolation layer between the first semiconductor layer and second semiconductor layer, a first control gate electrode between the first semiconductor layer and the isolation layer, a second control gate electrode between the second semiconductor layer and the isolation layer, wherein the second control gate electrode and first control gate electrode are respectively disposed at opposite sides of the isolation layer, a first charge storing layer between the first control gate electrode and the first semiconductor layer, and a second charge storing layer between the second control gate electrode and the second semiconductor layer.

According to another aspect of the inventive concept, there is provided a multi-layered, vertically stacked, nonvolatile memory device provided that comprises; a plurality of single layers vertically stacked on top of one another, wherein each single layer is formed in a common lateral plane by an alternating arrangement of first semiconductor layers and second semiconductor layers, wherein each first semiconductor layer extends in parallel with a corresponding second semiconductor layer and is separated from the second semiconductor layer by an isolation layer, a first control gate electrode is disposed between the first semiconductor layer and the isolation layer, and a second control gate electrode is disposed between the second semiconductor layer and the isolation layer, such that the second control gate electrode and first control gate electrode are respectively disposed at opposite sides of the isolation layer, a first charge storing layer is disposed between the first control gate electrode and the first semiconductor layer, and a second charge storing layer is disposed between the second control gate electrode and the second semiconductor layer.

According to another aspect of the inventive concept, there is provided a method of fabricating a nonvolatile memory device. The method comprises; forming a first semiconductor layer extending in parallel in a first direction with a corresponding second semiconductor layer, forming a first charge storing layer on an exposed sidewall of the first semiconductor layer and forming a second charge storing layer on an exposed sidewall of the second semiconductor layer, forming a first control gate electrode on the first charge storing layer and forming a second control gate electrode on the second charge storing layer, and forming an isolation layer between the first control gate electrode and the second control gate electrode.

BRIEF DESCRIPTION OF THE DRAWINGS

Exemplary embodiments of the inventive concept will be described in some additional detail with reference to accompanying drawings in which.

DESCRIPTION OF EMBODIMENTS

Hereinafter, the inventive concept will be described in some additional detail with reference to the accompanying drawings. The inventive concept may, however, be embodied in many different forms and should not be construed as being limited to only the embodiments set forth herein. Rather, these embodiments are provided as teaching examples.

Throughout the drawings, the relative thicknesses and/or sizes of certain layers and regions may be exaggerated for clarity. Throughout the drawings and written description, like reference numbers are used to indicate like or similar elements, layers, and/or regions.

The terms used in following description of embodiments may be interpreted as those understood by those of ordinary skill in the art, unless otherwise defined. The expression, 'at least one' means one or more than one and thus may be understood as being singular or plural. The term "on" may be used to describe one layer or region being formed directly on another layer or region, or intervening layers and/or regions may be present.

Figure 1:
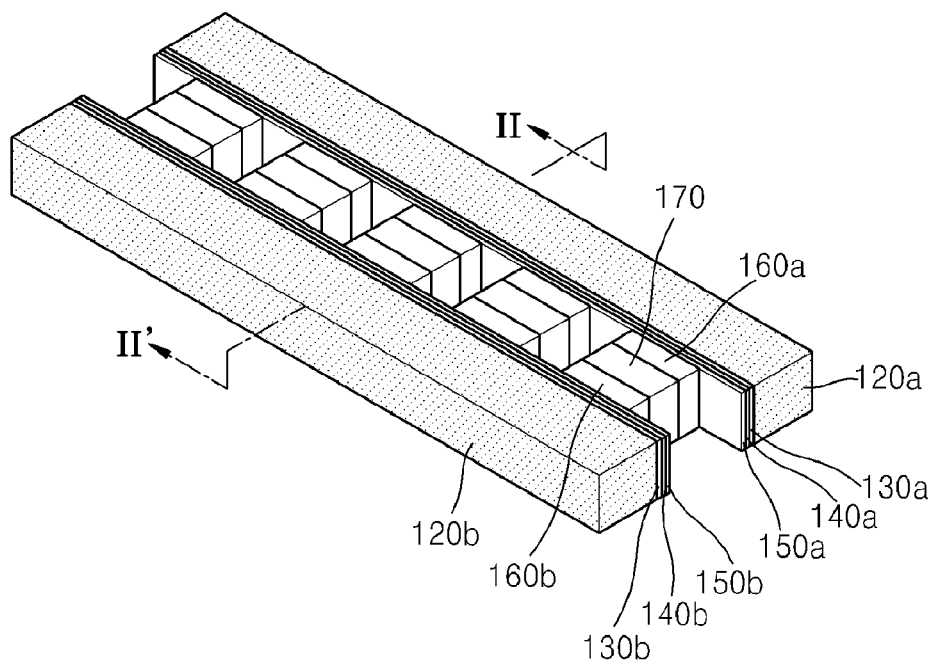
FIG. 1 is a perspective view of a portion of a nonvolatile memory device according to an embodiment of the inventive concept.
Figure 2:
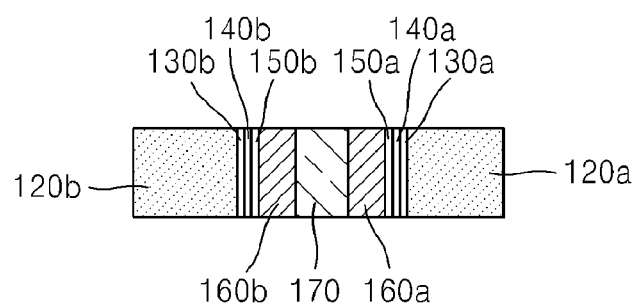
FIG. 2 is a cross-sectional view of the nonvolatile memory device of FIG. 1 taken along the line II-II'.

Figure (FIG.) 1 is a perspective view of a nonvolatile memory device according to an exemplary embodiment of the inventive concept. FIG. 2 is a cross-sectional view of the nonvolatile memory device of FIG. 1 taken along the line II-II'.

Referring collectively to FIGS. 1 and 2, at least one first semiconductor layer 120a and at least one second semiconductor layer 120b are provided. The first semiconductor layer 120a and the second semiconductor layer 120b are disposed on the same lateral plane facing each other. The terms "lateral" and "vertical" are relative in their respective orientation. For descriptive clarity, a lateral plane may be thought of being defined by any two orthogonal planes X/Y and a vertical plane (as in "vertically stacked") may be thought of as orthogonally intersecting a defined lateral plane. In the illustrated example of FIGS. 1 and 2, the first semiconductor layer 120a and second semiconductor layer 120b are arranged separated from and in parallel alignment with one another such that respective sidewalls face each other. In a related embodiment, the first semiconductor layer 120a and second semiconductor layer 120b may be formed from single crystalline epitaxial layers, or polysilicon layers.

At least one isolation (e.g., having an electrical insulation property) layer is provided between the first semiconductor layer 120a and second semiconductor layer 120b. In the illustrated embodiment of FIGS. 1 and 2, a plurality of isolation layer segments 170 is arranged at intervals along the lateral plane to separate the first semiconductor layer 120a from the second semiconductor layer 120b. Stated in other terms, the plurality of isolation segments extends in a first direction between the first semiconductor layer 120a and second semiconductor layer 120b. In the illustrated embodiment of FIGS. 1 and 2, the isolation layer segments 170 are approximately centered in the middle of a gap separating the opposing parallel sidewalls of the first semiconductor layer 120a and second semiconductor layer 120b. However, the number of the isolation layer segments 170 and their geometric arrangement between opposing semiconductor layers may be determined according to a desired capacity of the constituent nonvolatile memory device. In other embodiments of the inventive concept, the first semiconductor layer 120a and second semiconductor layer 120b may be separated by a continuously extending isolation layer, instead of defined isolation layer segments 170. Accordingly, the isolation structure separating the first semiconductor layer 120a and second semiconductor layer 120b will hereafter be generically referred to as "the isolation layer 170" regardless of particular patterning.

At least one first control gate electrode 160a, (i.e., a plurality of first control gate electrodes 160a) is provided (i.e., arranged at specified intervals) between the first semiconductor layer 120a and the isolation layer 170. In the illustrated embodiment of FIGS. 1 and 2, the first control gate electrodes 160a are respectively disposed along a first sidewall of the isolation layers 170 (i.e., the sidewall of isolation layer 170 facing the first semiconductor layer 120a). The number and arrangement of the first control gate electrodes 160a may be determined according to a desired capacity of the constituent nonvolatile memory device.

At least one second control gate electrode 160b, (i.e., a plurality of second control gate electrodes 160b) is provided between the first semiconductor layer 120b and the isolation layer 170. In the illustrated embodiment of FIGS. 1 and 2, the second control gate electrodes 160b are respectively disposed along a second sidewall of the isolation layer 170 (i.e., the sidewall of isolation layer 170 facing the first semiconductor layer 120b). In this manner, as one example, the isolation layer 170 is provided between the plurality of first control gate electrodes 160a and the plurality of second control gate electrodes 160b.

At least one first charge storing layer 140a is provided between the plurality of first control gate electrodes 160a and the first semiconductor layer 120a. In the illustrated embodiment of FIGS. 1 and 2, the first charge storing layer 140a extends in the first direction with the first semiconductor layer 120a and crosses in front of the plurality of first control gate electrodes 160a at respective intervals. In this manner, as one example, the first charge storing layer is provided between the plurality of first control gate electrodes 160a and the first semiconductor layer 120a. In a related embodiment, the continuous first charge storing layer 140a may be implemented as a plurality of segments patterned from a constituent material layer and corresponding one-for-one with the plurality of first control gate electrodes 160a.

At least one second charge storing layer 140b is similarly provided in relation to isolation layer 170, the plurality of second control gate electrodes 160b and second semiconductor layer 120b. The first charge storing layer 140a and second charge storing layer 140b are used as a charge trapping medium for data programming within the nonvolatile memory device. For example, the first charge storing layer 140a and second charge storing layer 140b may be employed as conventionally understood floating gate type elements or charge trapping type elements. Floating gate type elements may be implemented by forming the charge storing layers (140a and 140b) from conductive material such as polysilicon. Charge trapping type elements may be implemented by forming the charge storing layers (140a and 140b) from a silicon nitride layer, material(s) implementing quantum dots, and/or nanocrystals. Quantum dot and/or nanocrystals structures may be formed by dispersing one or more conductors (e.g., metal or semiconductor nano particles) within an insulating material. Charge trapping type elements locally store charge and may be used to provide multi-bit operations within the nonvolatile memory device.

At least one first tunneling insulating layer 130a is provided between the first charge storing layer 140a and first semiconductor layer 120a. In the illustrated embodiment of FIGS. 1 and 2, the first tunneling insulating layer 130a extends in the first direction with the first semiconductor layer 120a and crosses the plurality of first control gate electrodes 160a at respective intervals. As with the first charge trapping layer 140a, a plurality of first tunneling insulating layer segments may alternately be used between the plurality of first control gate electrodes 160a and the first semiconductor layer 120a.

At least one second tunneling insulating layer 130b is similarly provided with respect to the second charge storing layer 140b and second semiconductor layer 120b.

At least one first blocking insulating layer 150a is provided between the first charge storing layer 140a and the plurality of first control gate electrodes 160a. In the illustrated embodiment of FIGS. 1 and 2, the first blocking insulating layer 150a extends in the first direction with first semiconductor layer 120a and crosses the plurality of first control gate electrodes 160a at respective intervals. As with the first charge trapping layer 140a and the first tunneling layer 130a, a plurality of blocking insulation layer segments may alternately be used between the plurality of first control gate electrodes 160a and the first semiconductor layer 120a.

At least one second blocking insulating layer 150b is similarly provided with respect to the second charge storing layer 140b and the plurality of second control gate electrodes 160b.

Figure 3:
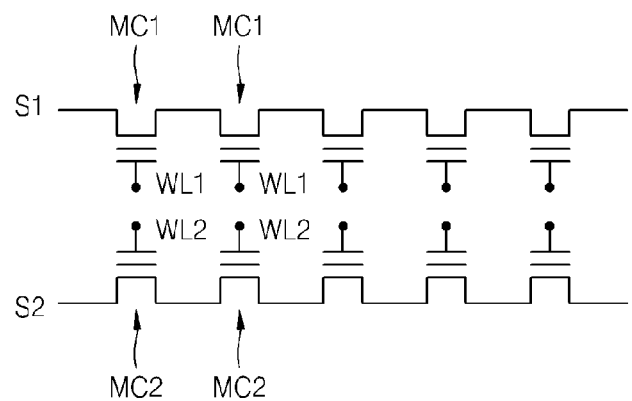
FIG. 3 is an equivalent circuit diagram for a nonvolatile memory device according to an embodiment of the inventive concept.

FIG. 3 is an equivalent circuit diagram of a nonvolatile memory device according to an exemplary embodiment of the inventive concept, such as the embodiment of FIGS. 1 and 2.

Referring collectively to FIGS. 1 through 3, a first stacked structure comprising the first semiconductor layer 120a and the first control gate electrodes 160a constitutes a first arrangement of first memory cells MC1. A second stacked structure comprising the second semiconductor layer 120b and the second control gate electrodes 160b constitutes a second arrangement of second memory cells MC2. The plurality of first control gate electrodes 160a may be operated as a first word line WL1 and the plurality of second control gate electrodes 160b may be independently operated as a second word line WL2. In this manner, the first arrangement of first memory cells MC1 may form a first string S1 of a NAND type flash memory device and the second arrangement of second memory cells MC2 may form a second string S2 of the NAND type flash memory device.

Within the foregoing arrangements, it is possible to vary the respective widths between adjacent ones of the plurality of first control gate electrodes 160a and/or the plurality of second control gate electrodes 160b to thereby alter the respective densities of the first arrangement of first memory cells MC1 and/or the second arrangement of second memory cells MC2. Accordingly, it is possible to reduce the length of the first string S1 and second string S2 to thereby increase overall integration degree of the constituent nonvolatile memory device.

Also of note, the first word lines WL1 and the second word lines WL2, as implemented above, are not shared. This relationship reduces the stress caused by repetitive operations performed in relation to the first arrangement of first memory cells MC1 and the second arrangement of memory cells MC2. Accordingly, the overall reliability of the constituent nonvolatile memory device may be improved.

Figure 4:
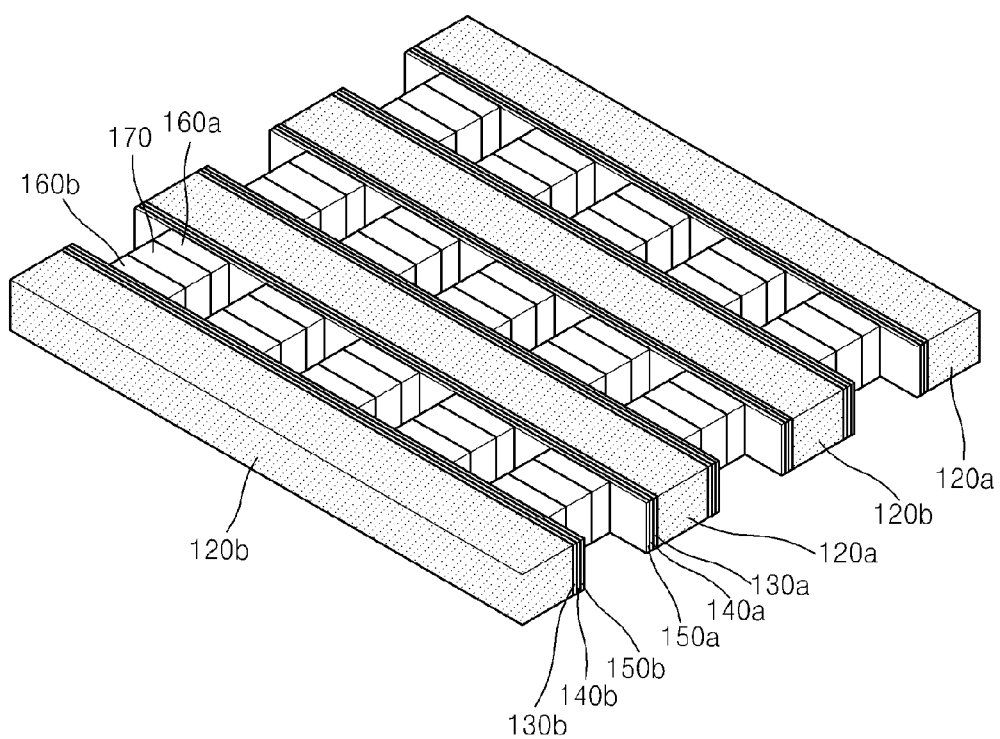
FIG. 4 is a perspective view of a portion of a nonvolatile memory device according to another embodiment of the inventive concept.

FIG. 4 is a perspective view of a nonvolatile memory device according to another exemplary embodiment of the inventive concept. This nonvolatile memory device is similar in many ways to the embodiment described in relation to FIGS. 1 through 3. Thus, elements and possible interrelationships previously described will not be reiterated in the current embodiment.

Referring to FIG. 4, a stacked arrangement of first semiconductor layers 120a and second semiconductor layers 120b is provided in a common plane (lateral or vertical with respect to a final orientation in the completed nonvolatile memory device). In any reasonable number, a plurality of first semiconductor layers 120a and a corresponding plurality of second semiconductor layers 120b are alternately arranged to implement the stacked arrangement of FIG. 4. Corresponding first arrangements of first memory cells MC1 and second arrangements of second memory cells MC2 are disposed in alternating adjacent dispositions. In effect, the resulting stacked arrangement of first memory cells MC1 and second memory cells MC2 forms a memory cell matrix within the defined common plane.

As described above, the relative integration degree of memory cells within the constituent nonvolatile memory device according to an embodiment of the inventive concept may be markedly increased using this approach.

Figure 5:
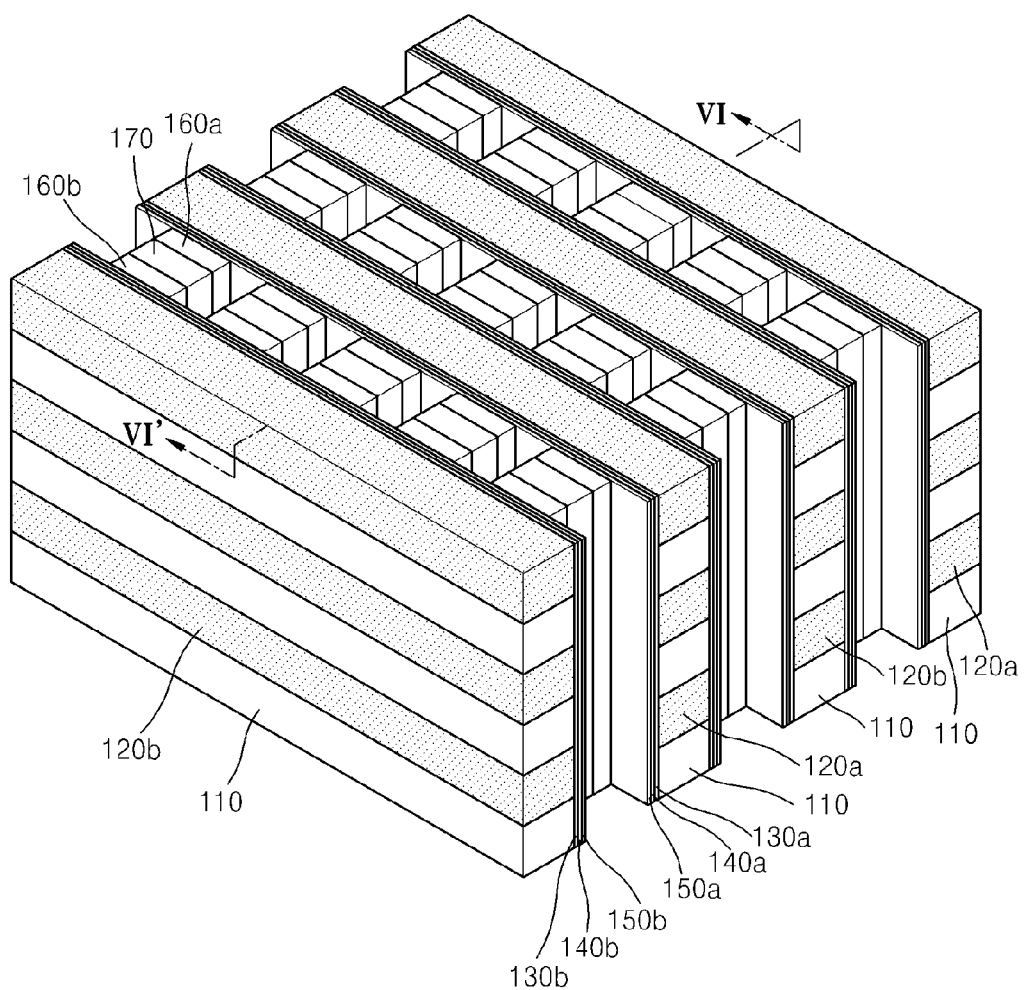
FIG. 5 is a perspective view of a portion of a nonvolatile memory device according to another embodiment of the inventive concept.
Figure 6:
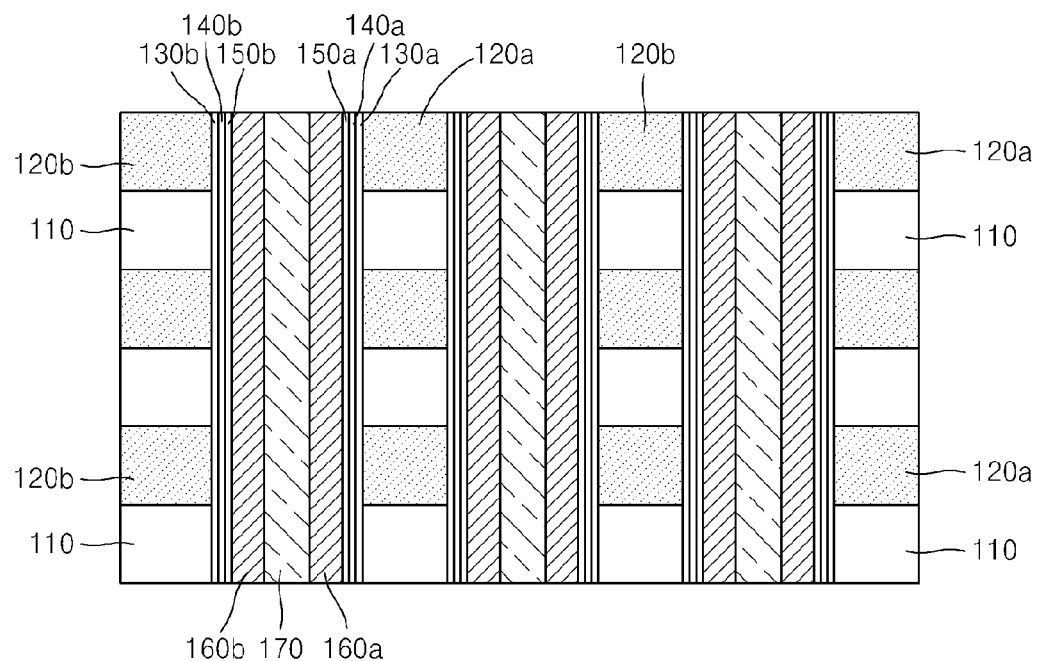
FIG. 6 is a cross-sectional view of the nonvolatile memory device of FIG. 5 taken along the line VI-VI'.

FIG. 5 is a perspective view of a nonvolatile memory device according to another embodiment of the inventive concept. FIG. 6 is a cross-sectional view of the nonvolatile memory device of FIG. 5 taken along the line VI-VI'. The nonvolatile memory device according to the current embodiment is as illustrated in FIGS. 1 through 4 and thus a description of constitutional elements that are the same as those of FIGS. 1 through 4 will not be provided here.

Referring to FIG. 5, a plurality of stacked arrangements, each stacked arrangement including a plurality of first semiconductor layers 120a alternately stacked with a plurality of second semiconductor layers 120b, are vertically stacked on top of one another to form a multi-layered vertically stacked arrangement. The composite vertically stacked arrangement implements a three-dimension array of memory cells occupying the same lateral plane footprint of a single stacked arrangement, such as the one shown in FIG. 4. Adjacent vertically stacked arrangements are separated by respective interlayer dielectric layers 110 that electrically insulate over and under first/second semiconductor layers 120a and 120b.

In the illustrated embodiment of FIG. 5, a plurality of first control gate electrodes 160a extends in a first direction along a corresponding first semiconductor layer 120a, and a plurality of second control gate electrodes 160b extend in the first direction along a corresponding second semiconductor layer 120b. The resulting vertically stacked collections of first and second control gate electrodes extend vertically up through the multi-layered vertically stacked arrangement. Isolation layer 170 and the material layers forming the vertically stacked collections of first and second control gates may extend upward through the multi-layered vertically stacked arrangement crossing multiple first and second semiconductor layers 120a and 120b. These elements may be implemented as a continuous, vertically running material, or as patterned material layer segments.

Similarly, first tunneling insulating layer 130a, first charge storing layer 140a and/or first blocking insulating layer 150a may extend upward through the multi-layered vertically stacked arrangement. The same may be true for second tunneling insulating layer 130b, second charge storing layer 140b and/or a second blocking insulating layer 150b.

The cross-sectional view of FIG. 6 shows the relative orientation of these material layers within a multi-layered vertically stacked arrangement according to an embodiment of the inventive concept.

The three-dimensional matrix of first memory cells MC1 and second memory cells MC2 (see e.g., FIG. 3) may be very densely integrated within a constituent nonvolatile memory device according to an embodiment of the inventive concept, and find ready application in host systems demanding large data storage capacity and access with minimal space allocation.

FIGS. 7 through 11 are related perspective views illustrating a method of fabricating a nonvolatile memory device according to an embodiment of the inventive concept.

Figure 7:
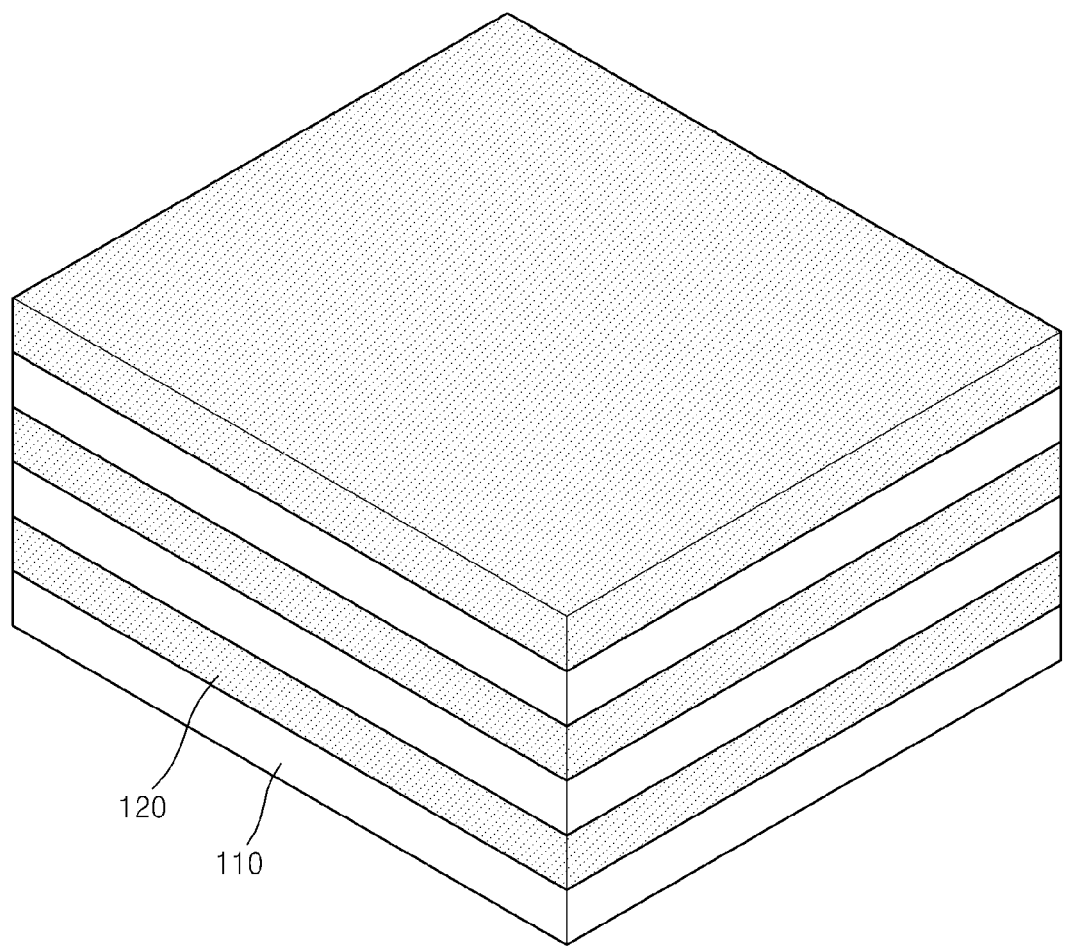
FIGS. 7 through 11 are related perspective views illustrating a method of fabricating a nonvolatile memory device according to an embodiment of the inventive concept.

Referring to FIG. 7, interlayer dielectric layers 110 and semiconductor layers 120 may be alternately deposited. For example, the semiconductor layers 120 may be grown as epitaxial layers from a seed layer (not shown). Alternately, the semiconductor layers 120 may be crystallized as single crystalline layers by forming amorphous layers through chemical vapor deposition (CVD) and thereafter performing thermal processing, such as laser annealing. Yet again, the semiconductor layers 120 may be formed from polysilicon layers deposited using conventional CVD processes.

Figure 8:
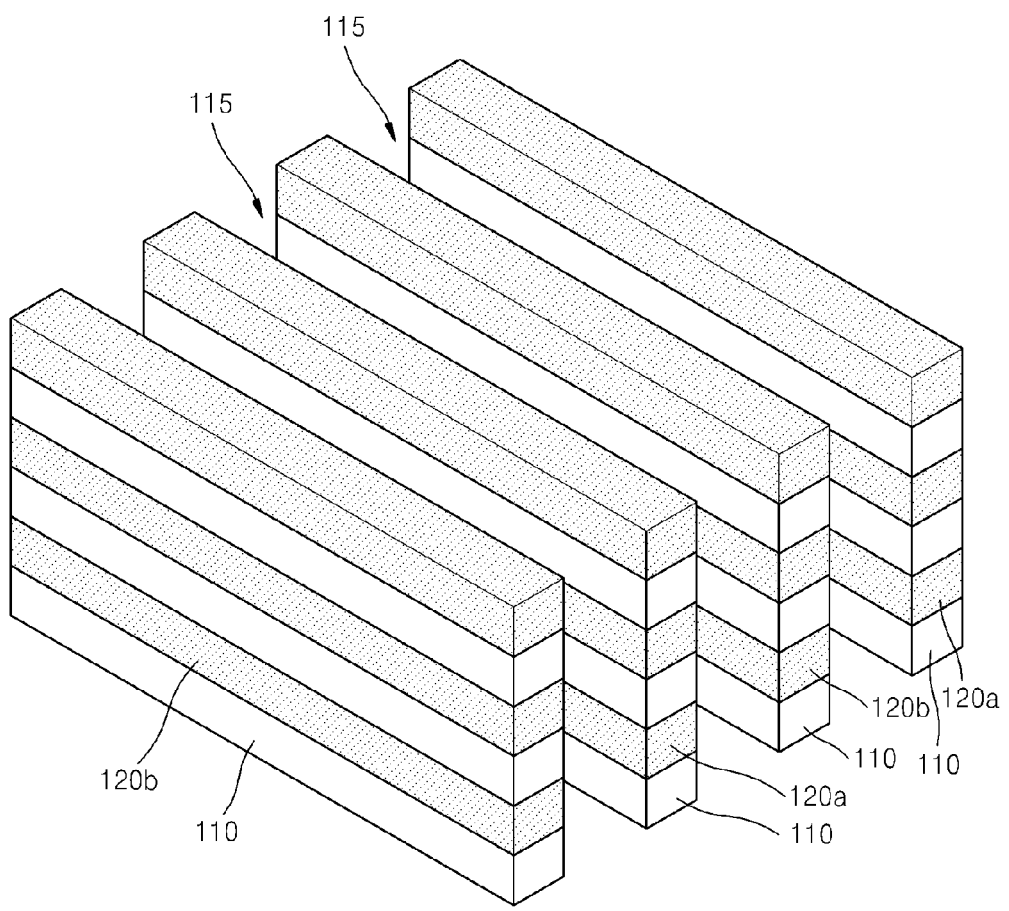

Referring to FIG. 8, the respective interlayer dielectric layers 110 and semiconductor layers 120 are patterned to form a plurality of trenches 115, each trench defining a separation gap between ultimately formed and opposing first and second semiconductor layers 120a and 120b. For example, the plurality of trenches 115 may be obtained using conventionally understood photolithography and etching processes. In this manner the stacked semiconductor layers 120 may be divided into opposing first semiconductor layers 120a and second semiconductor layers 120b. The result is a stacked arrangement of first and second semiconductor layers 120a and 120b having a three dimensional structure that is the combination of arrays of semiconductor layers disposed in respective common (lateral) planes.

Figure 9:
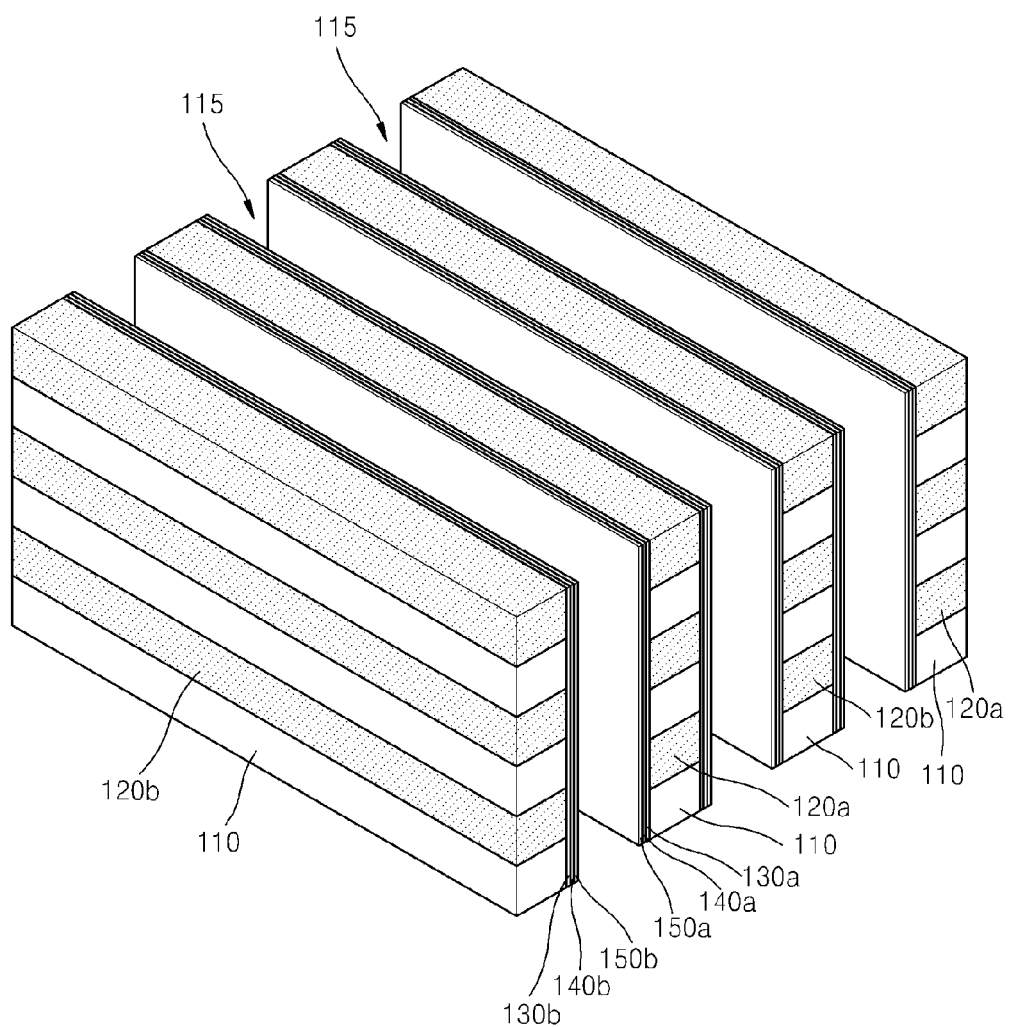

Referring to FIG. 9, a stacked structure comprising first tunneling insulating layer 130a, first charge storing layer 140a, and first blocking insulating layer 150a is formed on exposed sidewalls of the stacked first semiconductor layers 120a. At the same time, a stacked structure of second tunneling insulating layer 130b, second charge storing layer 140b, and second blocking insulating layer 150b is formed on exposed sidewalls of the stacked second semiconductor layers 120b.

That is, the first tunneling insulating layers 130a and the second tunneling insulating layers 130b may be simultaneously formed. The first charge storing layers 140a and the second charge storing layers 140b may be simultaneously formed, and the first blocking insulating layers 150a and the second blocking insulating layers 150b may be simultaneously formed.

Figure 10:
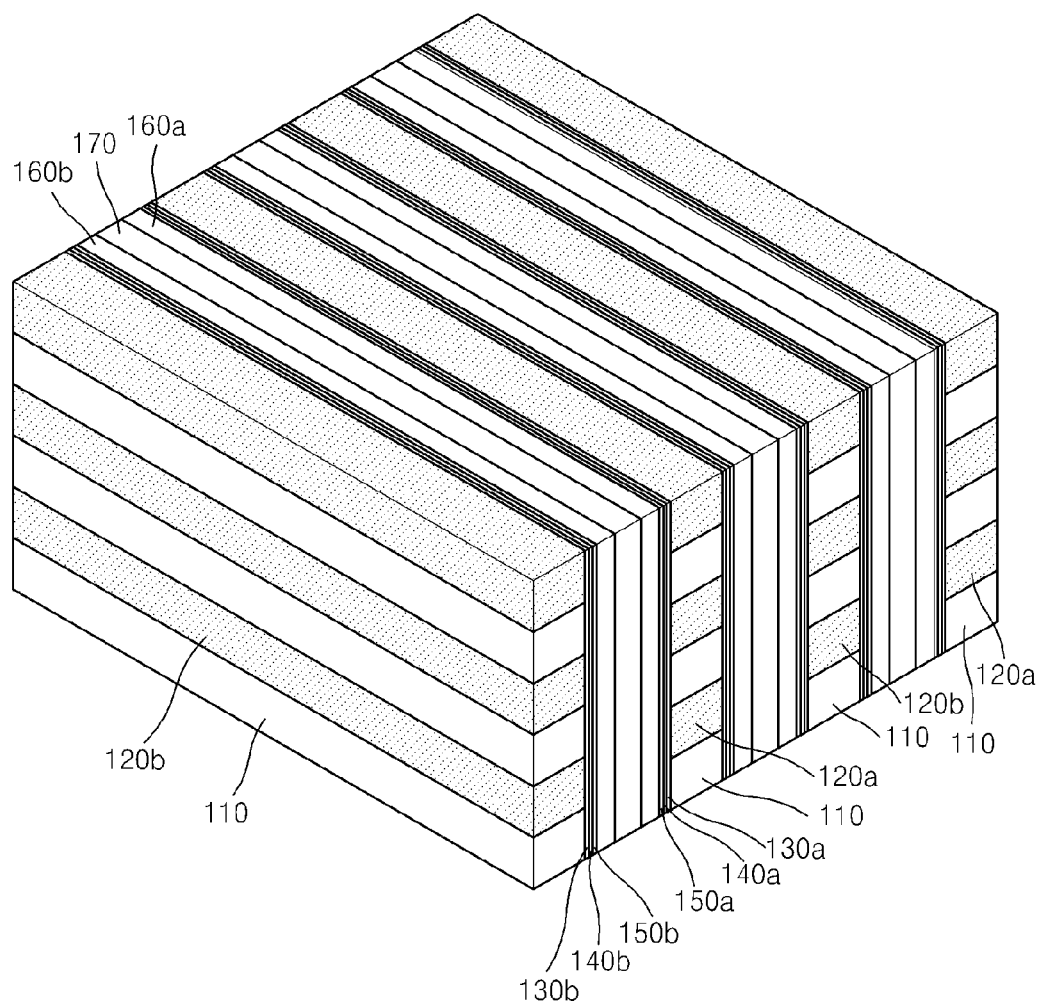

Referring to FIG. 10, a first control gate electrode layer 160a is then formed on the stacked structure of the first tunneling insulating layer 130a, first charge storing layer 140a, and first blocking insulating layer 150a within the plurality of trenches 115. A second control gate electrode layer 160b is also formed on the stacked structure of the second tunneling insulating layer 130b, second charge storing layer 140b, and second blocking insulating layer 150b within the plurality of trenches 115. Also, isolation insulating layers 170 is formed between the first control gate electrode layer 160a and the second control gate electrode layer 160b. The first control gate electrode layer 160a and the second control gate electrode layer 160b may be simultaneously formed using conventionally understood process in relation to the particular type of memory cells being implemented within the resulting nonvolatile memory device.

Figure 11:
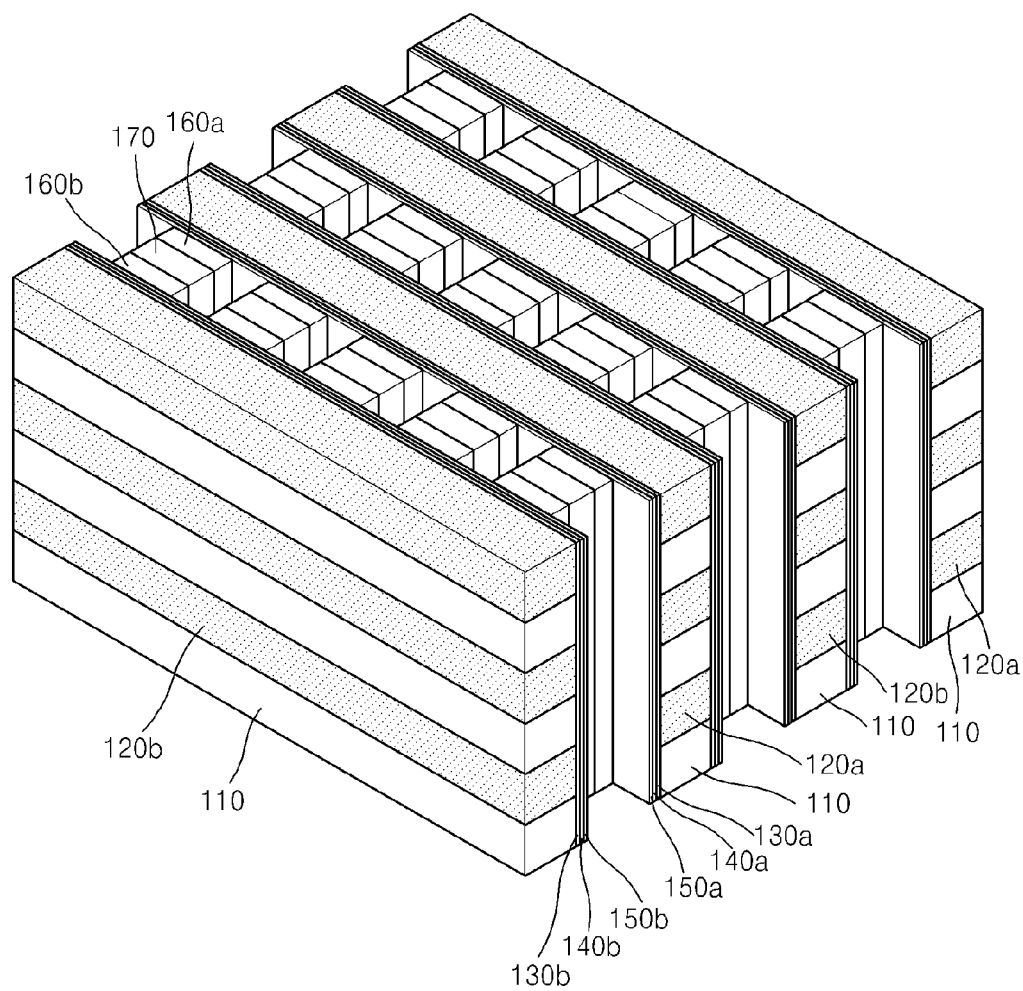

Referring to FIG. 11, the first control gate electrode layer 160a, isolation insulating layers 170, and second control gate electrode layer 160b may be patterned using conventional photolithography and etching processes to yield a plurality of first control gate electrodes 160a and a plurality of second control gate electrodes 160b.

According to the above method, the respective gate electrodes of a three dimensional nonvolatile memory device may be fabricated with a great economy of processing steps.

Figure 12:
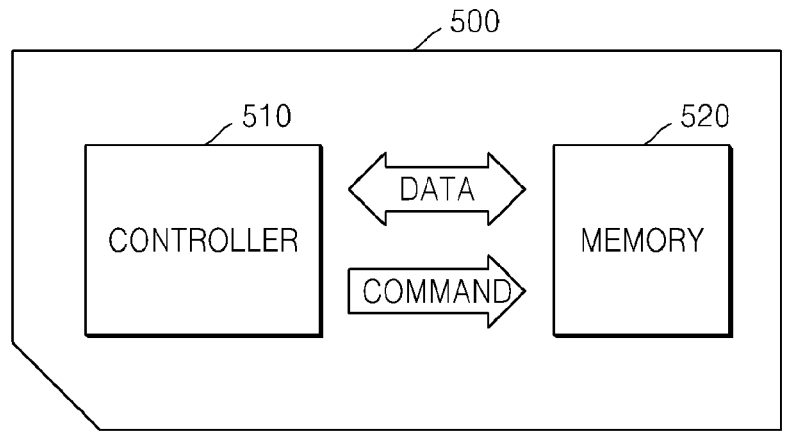
FIG. 12 is a general block diagram schematically illustrating a memory card adapted to the incorporation of a nonvolatile memory device according to an embodiment of the inventive concept.

FIG. 12 is a general block diagram schematically illustrating a card 500 susceptible to the incorporation of one or more nonvolatile memory devices according to an embodiment of the inventive concept. Referring to FIG. 12, a controller 510 and a memory device 520 may exchange data under the control of controller 510. Any one of numerous conventional data communication protocols may be used to facilitate data exchange. Thus, data may be stored on card 500 within memory device 520 having a multi-layered vertically stacked arrangement consistent with an embodiment of the inventive concept. For example, memory device 520 may have the same structure as the nonvolatile memory devices illustrated in FIGS. 1 through 6.

Card 500 may be used as a data storage medium within various portable devices. For example, card 500 may be implemented as a memory card, such as the type commonly used as multi media cards (MMC) or a secure digital (SD) cards.

Figure 13:
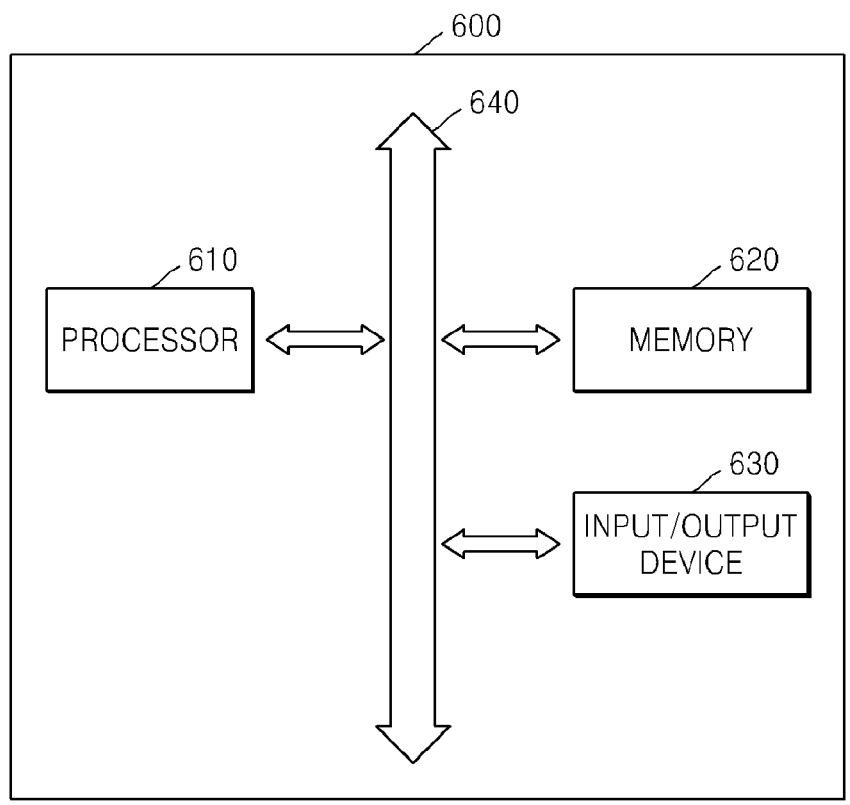
FIG. 13 is a general block diagram of an electronic system adapted to the incorporation of a nonvolatile memory device according to an embodiment of the inventive concept.

FIG. 13 is a general block diagram of an electronic system 600 susceptible to the incorporation of a nonvolatile memory device according to an embodiment of the inventive concept. Referring to FIG. 13, a processor 610, and a memory 620 and an input/output device 630 may establish a data communication with one another via a bus 640. The processor 610 may execute a program and control the system 600. The input/output device 630 may be used to input data to or output data from the system 600. The system 600 may be connected to an external device, e.g., a personal computer or a network, via the input/output device 630 in order to exchange data with the external device.

The memory 620 may store code and data for operating the processor 610. For example, the memory 620 may have the same structure as any of the nonvolatile memory devices illustrated in FIGS. 1 through 6.

For example, the system 600 may constitute various electronic control devices that need the memory 620 and be applied to a mobile phone, an MP3 player, navigation, a solid state disk (SSD) or household appliances.

While the inventive concept has been particularly shown and described with reference to exemplary embodiments thereof, it will be understood that various changes in form and details may be made therein without departing from the scope of the following claims.

What is claimed is:

1. A multi-layered, vertically stacked, nonvolatile memory device, comprising:
    a plurality of single layers vertically stacked on top of one another, wherein each single layer is formed in a common lateral plane by an alternating arrangement of first semiconductor layers and second semiconductor layers;
    wherein each first semiconductor layer extends in parallel with a corresponding second semiconductor layer and is separated from the second semiconductor layer by an isolation layer;
    a first control gate electrode is disposed between the first semiconductor layer and the isolation layer, wherein the first control gate electrode comprises a plurality of first control gate electrodes spaced apart and extending in the first direction, and a second control gate electrode is disposed between the second semiconductor layer and the isolation layer, wherein the second control gate electrode comprises a plurality of second control gate electrodes spaced apart and extending in the first direction, such that the second control gate electrode and first control gate electrode are respectively disposed at opposite sides of the isolation layer;
    a first charge storing layer is disposed between the first control gate electrode and the first semiconductor layer, and a second charge storing layer is disposed between the second control gate electrode and the second semiconductor layer;
    a first tunneling insulating layer disposed between the first charge storing layer and the first semiconductor layer;

a second tunneling insulating layer disposed between the second charge storing layer and the second semiconductor layer;

a first blocking insulating layer disposed between the first charge storing layer and the first control gate electrode;

a second blocking insulating layer disposed between the second charge storing layer and the second control gate electrode, wherein the isolation layer comprises a continuous isolation layer extending upward through the multi-layered vertically stacked nonvolatile memory device and separating the plurality of first control gate electrodes and the opposing plurality of second gate electrodes.

2. The nonvolatile memory device of claim 1, wherein the first charge storing layer continuously extends upward through the multi-layered vertically stacked nonvolatile memory device across the plurality of the first control gate electrodes, and the second charge storing layer continuously extends upward through the multi-layered vertically stacked nonvolatile memory device across the plurality of the second control gate electrodes.

3. The nonvolatile memory device of claim 1, further comprising:

a plurality of interlayer dielectric layers respectively separating adjacent ones of the stacked plurality of single layers such that adjacent upper and lower first semiconductor layers and the second semiconductor layers are electrically insulated.

4. A method of fabricating a multi-layered, vertically stacked nonvolatile memory device, the method comprising:

vertically stacking a plurality of single layers, wherein each single layer is formed in a common lateral plane by an alternating arrangement of first semiconductor layers and second semiconductor layers extending in parallel in a first direction and separated by an isolation layer;

each single layer being formed by, forming a first control gate electrode between the first semiconductor layer and the isolation layer, wherein the first control gate electrode comprises a plurality of first control gate electrodes spaced apart and extending in the first direction;

forming a second control gate electrode between the second semiconductor layer and the isolation layer, wherein the second control gate electrode comprises a plurality of second control gate electrodes spaced apart and extending in the first direction, such that the second control gate electrode and first control gate electrode are respectively disposed at opposite sides of the isolation layer;

forming a first charge storing layer between the first control gate electrode and the first semiconductor layer and forming a second charge storing layer between the second control gate electrode and the second semiconductor layer;

forming a first tunneling insulating layer between the first charge storing layer and the first semiconductor layer;

forming a second tunneling insulating layer between the second charge storing layer and the second semiconductor layer;

forming a first blocking insulating layer between the first charge storing layer and the first control gate electrode; and forming a second blocking insulating layer between the second charge storing layer and the second control gate electrode, wherein the isolation layer comprises a continuous isolation layer extending upward through the multi-layered vertically stacked nonvolatile memory device and separating a plurality of first control gate electrodes and an opposing plurality of second gate electrodes.

5. The method of claim 4, wherein for each single layer, the first charge storing layer and the second charge storing layer are formed simultaneously, and the first control gate electrode and the second control gate electrode are formed simultaneously.

6. The method of claim 4, wherein for each single layer, the first tunneling insulating layer and the second tunneling insulating layer are formed simultaneously.

7. The method of claim 4, wherein for each single layer, the first blocking insulating layer and the second blocking insulating layer are formed simultaneously.

* * * * *